(12) United States Patent
Eguchi

(10) Patent No.: US 7,999,265 B2
(45) Date of Patent: Aug. 16, 2011

(54) PHOTOELECTRIC CONVERSION DEVICE, ELECTRO-OPTIC DEVICE, AND ELECTRONIC DEVICE

(75) Inventor: Tsukasa Eguchi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 56 days.

(21) Appl. No.: 12/635,358

(22) Filed: Dec. 10, 2009

(65) Prior Publication Data

US 2010/0171122 A1 Jul. 8, 2010

(30) Foreign Application Priority Data

Jan. 7, 2009 (JP) ................................. 2009-001532

(51) Int. Cl.
*H01L 29/15* (2006.01)
(52) U.S. Cl. ............ 257/72; 257/66; 257/444; 257/446; 257/466; 257/E27.132
(58) Field of Classification Search .................... 257/66, 257/72, 444, 446, 466, E27.132
See application file for complete search history.

(56) References Cited

U.S. PATENT DOCUMENTS 7,663,080 B2 * 2/2010 Tsai .............................. 250/205

FOREIGN PATENT DOCUMENTS

| JP | A-11-121731 | 4/1999 |
| JP | A-2008-85029 | 4/2008 |
| JP | A-2008-122659 | 5/2008 |

* cited by examiner

*Primary Examiner* — Tu-Tu V Ho
(74) *Attorney, Agent, or Firm* — Oliff & Berridge, PLC

(57) ABSTRACT

The photoelectric conversion device includes: a photoelectric conversion element in which a first electrode, a photoelectric conversion layer, and a second electrode are stacked in this order; and a thin film transistor (TFT) connected to the first electrode of the photoelectric conversion element via a contact hole, wherein the photoelectric conversion layer including a first photoelectric conversion layer disposed at a location which does not overlap with the contact hole and a second photoelectric conversion layer disposed at a location which overlaps with the contact hole, the first photoelectric conversion layer and the second photoelectric conversion layer are separated from each other by a separation groove, and the second electrode is selectively formed on the first photoelectric conversion layer, and the photoelectric conversion element is formed by the first electrode, the first photoelectric conversion layer, and the second electrode.

3 Claims, 9 Drawing Sheets

PHOTOELECTRIC CONVERSION DEVICE, ELECTRO-OPTIC DEVICE, AND ELECTRONIC DEVICE

BACKGROUND

1. Technical Field

The present invention relates to a photoelectric conversion device, an electro-optic device, and an electronic device.

2. Related Art

A photoelectric conversion device is widely being used as an image sensor in facsimiles, copying machines, video cameras, and digital still cameras. Further, an electro-optic device with a built-in photoelectric conversion element in which a photoelectric conversion element is formed integrally with a pixel portion of a display panel is also been proposed (for example, see JP-A-11-121731, JP-A-2008-85029, and JP-A-2008-122659). The photoelectric conversion device and the electro-optic device commonly have a structure in which a photoelectric conversion element including a photodiode and a thin film transistor (TFT) for amplifying and extracting a signal from the photoelectric conversion element are stacked with an insulating film interposed therebetween and connected to each other via a contact hole formed in the insulating film in order to increase the pixel density and reduce the size of an optical system.

However, in the above-described structure, since a conductive film which connects the photoelectric conversion element with the TFT becomes locally thinner due to a step difference of the contact hole portion, when a semiconductor layer (a photoelectric conversion layer) of the photoelectric conversion element is etched, the conductive film may be partially disconnected. For this reason, JP-A-11-121731 and JP-A-2008-85029 have proposed a configuration in which the photoelectric conversion element is disposed directly above the contact hole and the conductive film on the contact hole is protected by the photoelectric conversion element. However, in this configuration, since the semiconductor layer (the photoelectric conversion layer) disposed directly above the contact hole is much thinner in film thickness than other portions, there is a problem in that a leak current is generated in that portion, noise is increased, and dynamic range (sensitivity) deteriorates.

SUMMARY

An advantage of some aspects of the invention is that it provides a photoelectric conversion device with high sensitivity and a high yield ratio. Another advantage of some aspects of the invention is that it provides a high-performance electro-optic device and electronic device with a built-in photoelectric conversion device.

According to an aspect of the invention, there is provided a photoelectric conversion device, including: a photoelectric conversion element, in which a first electrode, a photoelectric conversion layer, and a second electrode are stacked in this order; and a thin film transistor (TFT) connected to the first electrode of the photoelectric conversion element via a contact hole, wherein the photoelectric conversion layer including a first photoelectric conversion layer disposed at a location which does not overlap with the contact hole and a second photoelectric conversion layer disposed at a location which overlaps with the contact hole, the first photoelectric conversion layer and the second photoelectric conversion layer are separated from each other by a separation groove, and the second electrode is selectively formed on the first photoelectric conversion layer, and the photoelectric conversion element is formed by the first electrode, the first photoelectric conversion layer, and the second electrode.

According to another aspect of the invention, there is provided an electro-optic device in which a pixel, in which a pixel electrode is formed, and a sensor, in which a photoelectric conversion element is formed, are formed on the same substrate, including: the photoelectric conversion element including a first electrode, a photoelectric conversion layer, and a second electrode which are stacked in this order; and a thin film transistor (TFT) connected to the first electrode of the photoelectric conversion element via a contact hole, wherein the photoelectric conversion layer including a first photoelectric conversion layer disposed at a location which does not overlap with the contact hole and a second photoelectric conversion layer disposed at a location which overlaps with the contact hole, the first photoelectric conversion layer and the second photoelectric conversion layer are separated from each other by a separation groove, and the second electrode is selectively formed on the first photoelectric conversion layer, and the photoelectric conversion element is formed by the first electrode, the first photoelectric conversion layer, and the second electrode.

An electronic device of the invention includes the electro-optic device of the invention.

According to the photoelectric conversion device, the electro-optic device, and the electronic device of the invention, since a portion of the first electrode formed to the contact hole is protected by the second photoelectric conversion layers, the first electrode corresponding to the contact hole is prevented from being disconnected when the photoelectric conversion layer is etched. Further, since the second photoelectric conversion layer is formed to be separated from the first photoelectric conversion layer, a leak current generated in the second photoelectric conversion layer does not affect operations of the photoelectric conversion element. Therefore, the photoelectric conversion device, the electro-optic device, and the electronic device with high sensitivity and high yield ratio are provided.

The "separation groove" refers to an area for electrically separating the first photoelectric conversion layer from the second photoelectric conversion layer and is typically formed in an area in which the photoelectric conversion layer is not formed. The separation groove is not limited to a thin and long shape imaginable from the word groove, and any shape having a function of electrically separating the first photoelectric conversion layer from the second photoelectric conversion layer is included within the range of the "separation groove".

BRIEF DESCRIPTION OF THE DRAWINGS

The invention will be described with reference to the accompanying drawings, wherein like reference numbers represent like elements.

DESCRIPTION OF EXEMPLARY EMBODIMENTS

Photoelectric Conversion Device

Figure 1:
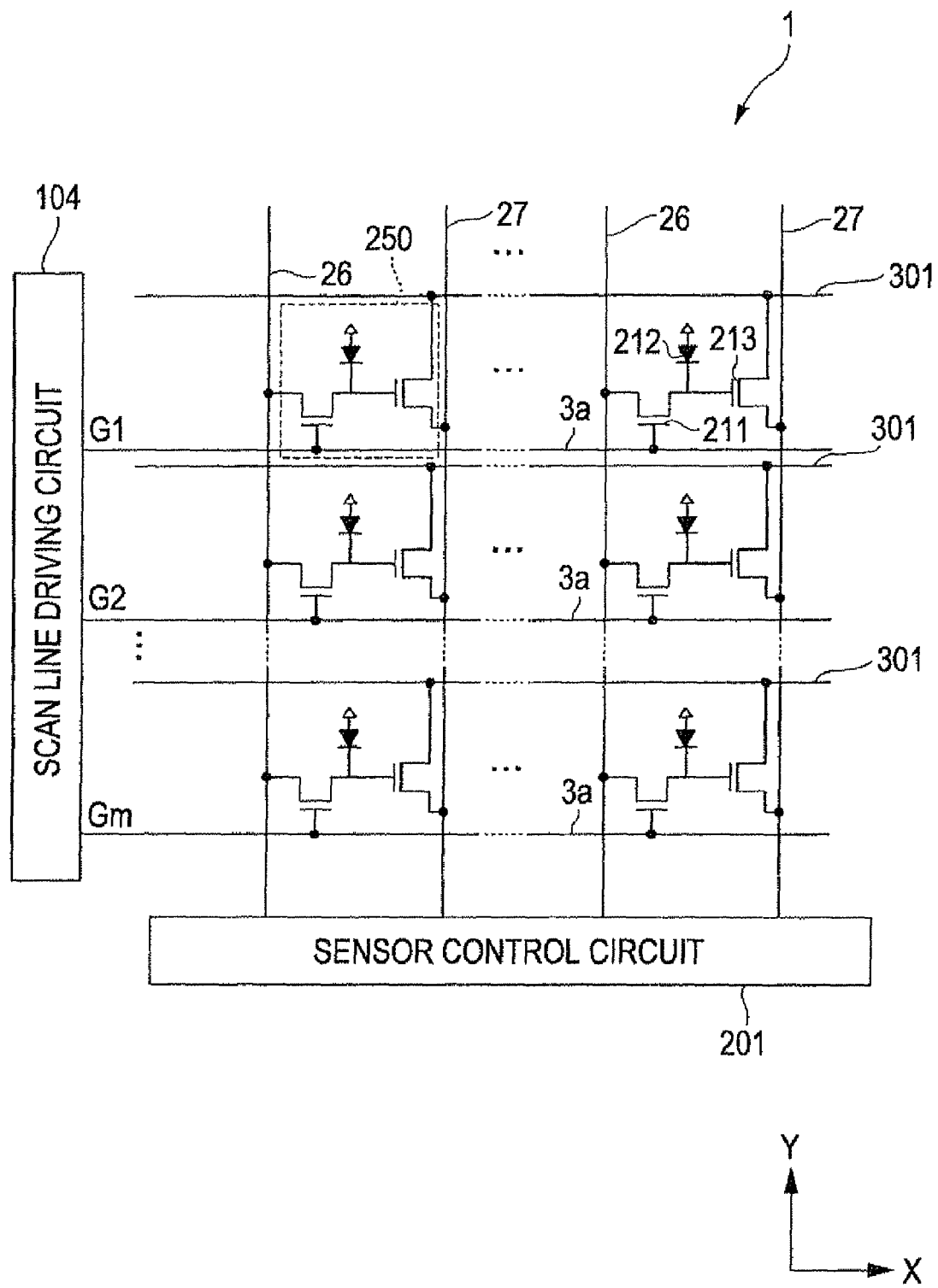
FIG. 1 is an equivalent circuit of an image sensor as an example of a photoelectric conversion device of the invention.
Figure 2:
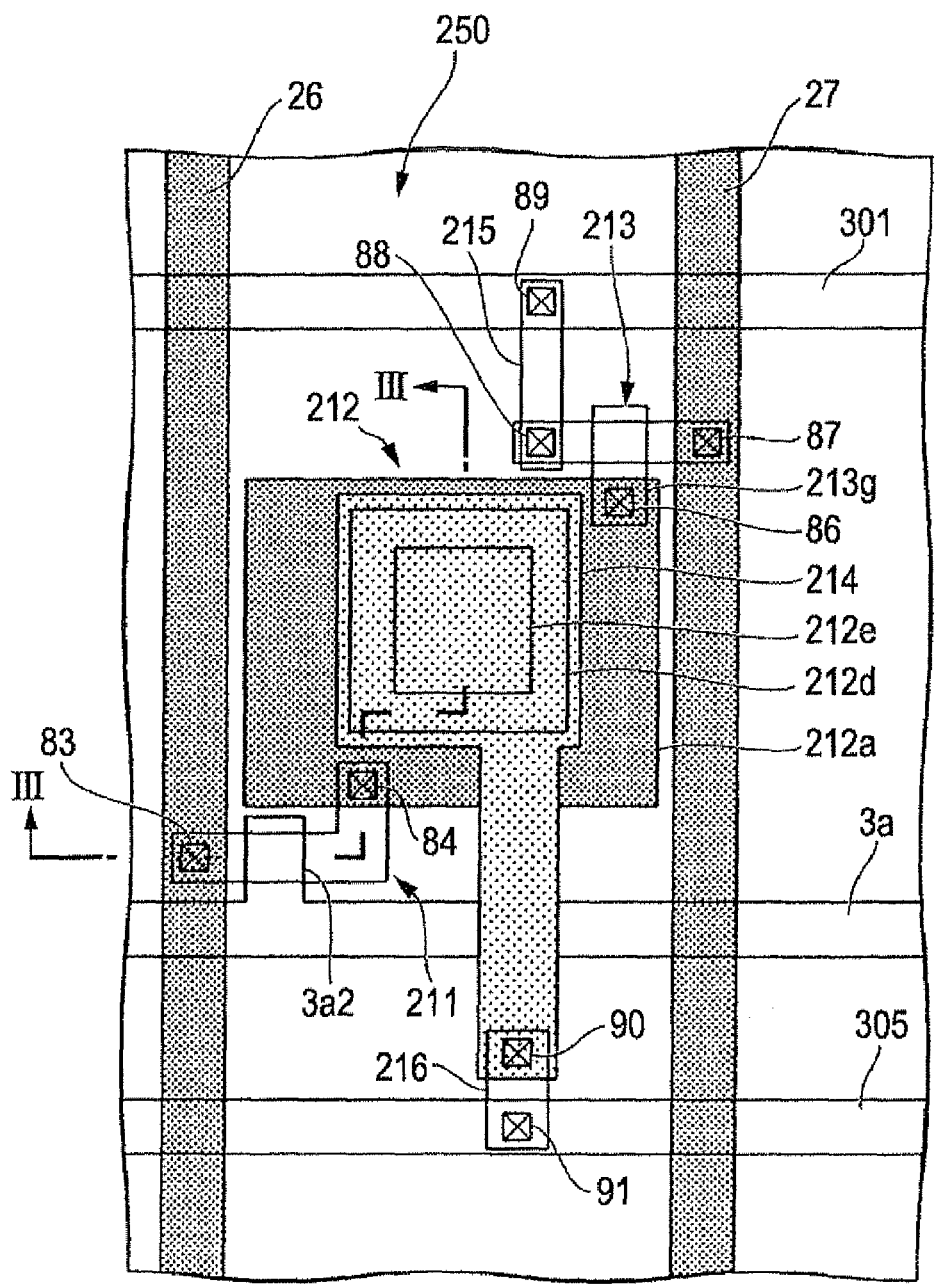
FIG. 2 is a plan view of one pixel of the image sensor.
Figure 3:
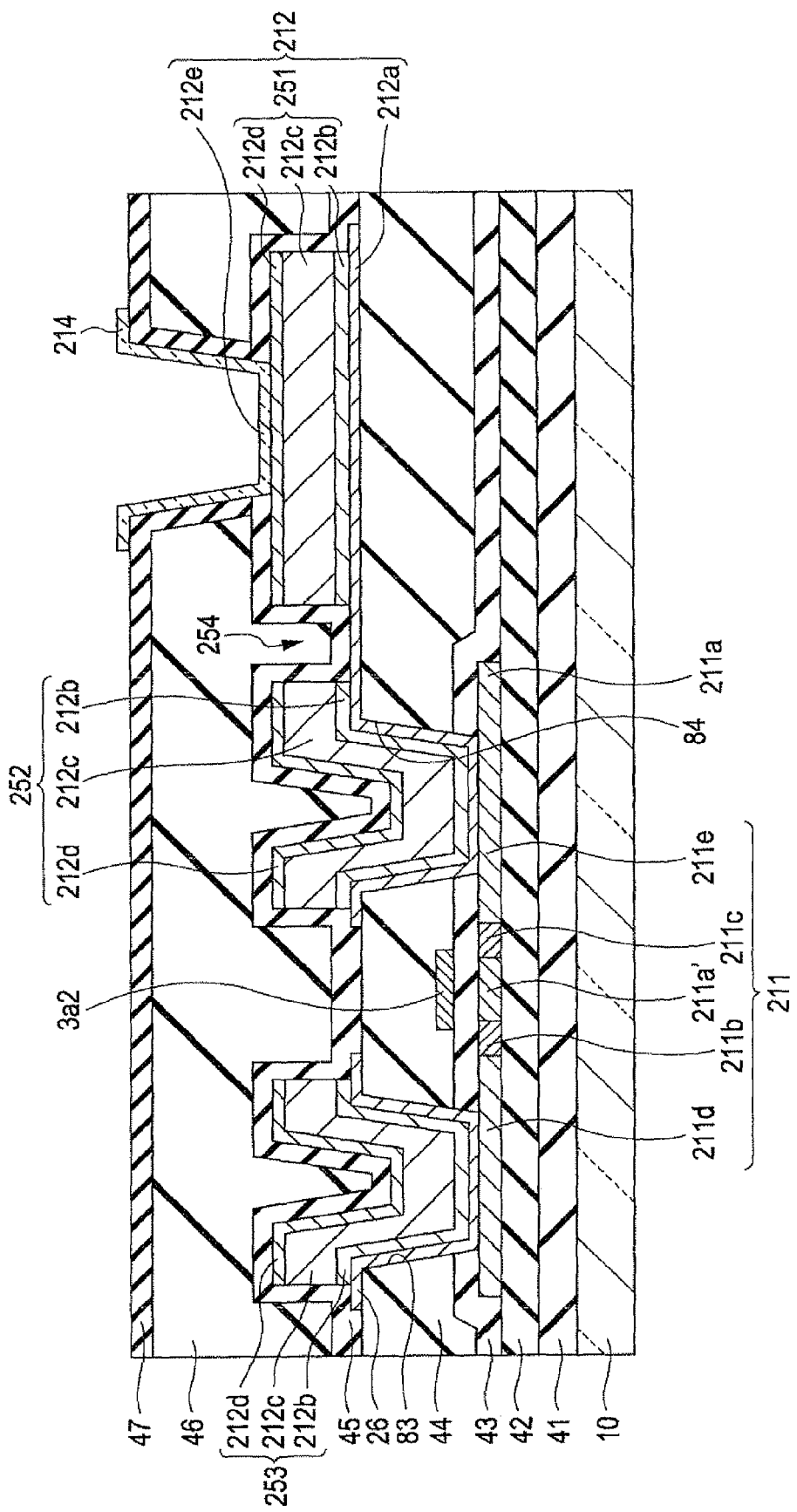
FIG. 3 is a cross-sectional view taken along line III-III of FIG. 2.

First, an image sensor 1 as an example of a photoelectric conversion device of the invention will be described with reference to FIGS. 1 to 3. FIG. 1 is an equivalent circuit of various elements and wirings of a plurality of sensors 250 which configure a light receiving area of the image sensor 1 and are formed in a matrix form. FIG. 2 is a plan view of one pixel of the image sensor 1. FIG. 3 is a cross-sectional view taken along line III-III of FIG. 2.

In FIG. 1, each of the sensors 250 formed in a matrix form includes a PIN diode 212 as an example of a "photoelectric conversion element" of the invention and TFTs 211 and 213. The sensor 250 is electrically connected to a sensor control circuit 201. The sensor control circuit 201 applies a control signal for controlling an operation of the sensor 250 to the sensor 250 via a sensor pre-charge control line 26, and an output signal including image information detected by the sensor 250 is output to the sensor control circuit 201 via a sensor output control line 27.

A gate of the TFT 211 is electrically connected to a scan line 3a, and a source thereof is electrically connected to the sensor pre-charge control line 26. A drain of the TFT 211 is electrically connected to the PIN diode 212 and a gate of the TFT 213. The TFT 211 is switched to on or off by a control signal applied through the TFT scan line 3a. The PIN diode 212 is pre-charged by a pre-charge voltage applied through the sensor pre-charge control line 26 and the TFT 211.

The gate of the TFT 213 is electrically connected to the PIN diode 212, and the TFT 213 is switched to on or off by a voltage generated in response to a change of a charge amount accumulated in the PIN diode 212. In further detail, since a change of a charge amount occurring in the PIN diode 212 is caused by light detected by the PIN diode 212, when image information is detected by the PIN diode 212, an operation state of the TFT 213 is switched to an on state. The output signal including image information is an amplification signal in which electric potential of a signal line 301 is amplified and output to the sensor output control line 27 via the TFT 213.

Next, a configuration of the sensor 250 will be described in detail with reference to FIGS. 2 and 3. FIG. 2 is a plan view of one pixel of the sensor 250. FIG. 3 is a cross-sectional view taken along line III-III of FIG. 2. In FIGS. 2 and 3, the scale sizes of respective layers and respective members are different so that respective layers and respective members can be made to have perceptible sizes.

In FIG. 2, the PIN diode 212 which has a rectangular shape in a planar view is disposed in the sensor 250. The PIN diodes 212 are disposed in an X direction and a Y direction in a matrix form corresponding to the respective sensors 250. The scan line 3a, the signal line 301, and a wiring 305 extends along a boundary of the PIN diode 212 in the X direction, and the sensor pre-charge control line 26 and the sensor output control line 27 extend along a boundary of the PIN diode 212 in the Y direction.

A source of the TFT 211 is electrically connected to the sensor pre-charge control line 26 via a contact hole 83, and a drain thereof is electrically connected to a lower electrode 212a of the PIN diode 212 via a contact hole 84. A gate electrode 3a2 of the TFT 211 is a portion that the scan line 3a extends in the Y direction. A driving state of the TFT 211 can be switched by a gate voltage applied to a channel area via the gate electrode 3a2.

A conductive film 214 which includes an upper electrode 212e as a part extends in the Y direction and is connected to the wiring 305 via a contact hole 90, a relay layer 216, and a contact hole 91. The wiring 305 is maintained at a fixed potential by a power source (not illustrated), and the upper electrode 212e is also maintained at a fixed potential.

A source of the TFT 213 is electrically connected to the signal line 301 via a contact hole 89, a relay layer 215, and a contact hole 88, and a drain thereof is electrically connected to the sensor output control line 27 via a contact hole 87. A gate electrode 213g of the TFT 213 is electrically connected to the lower electrode 212a via a contact hole 86.

The PIN diode 212 includes the lower electrode 212a and the upper electrode 212e which respectively contact lower and upper surface of a device body. The lower electrode 212a is electrically connected to the drain of the TFT 211 via a contact hole 84. Therefore, when light is incident to the PIN diode 212 at the time of an operation of the TFTs 211 and 213, an output signal is output to the sensor signal control line 27 based on an optical current generated in the PIN diode 212 in response to light.

In FIG. 3, the image sensor 1 includes insulating films 41, 42, 43, 44, 45, 46, and 47 which are stacked on a TFT array substrate 10, and the TFT 211 is formed in a stacking structure configured by the insulating films.

In FIG. 3, the TFT 211 has a lightly doped drain (LDD) structure in which a channel area 211a', a source area 211d, a drain area 211e, and LDD areas 211b and 211c are formed in a semiconductor layer 211a.

The PIN diode 212 includes the lower electrode 212a, an N-type semiconductor layer 212b, a light receiving layer 212c formed of a poly-silicon layer, a P-type semiconductor layer 212d, and the upper electrode 212e, which are stacked on the insulating film 44 in this order.

The "photoelectric conversion layer" of the invention is formed by the N-type semiconductor layer 212b, the light receiving layer 212c, and the P-type semiconductor layer 212d. A first photoelectric conversion layer 251 disposed at a location which does not overlap with the contact hole 84 and a second photoelectric conversion layer 252 disposed at a location which overlaps with the contact hole 84 are formed on the lower electrode 212a. A separation groove 254 is formed between the first photoelectric conversion layer 251 and the second photoelectric conversion layer 252. The first photoelectric conversion layer 251 and the second photoelectric conversion layer 252 are separated from each other by the separation groove 254.

Similarly, a second photoelectric conversion layer 253 is formed at a location which overlaps with a contact hole 83 on the sensor pre-charge control line 26. The second conversion layer 253 formed on the sensor pre-charge control line 26 and the first and second photoelectric conversion layers 251 and 252 formed on the lower electrode 212a are separated from each other and electrically insulated from each other.

Even though not illustrated, in FIG. 2, the second photoelectric conversion layer is also formed at a location which overlaps with the contact hole 86 on the lower electrode 212a. A separation groove is formed between the second photoelectric conversion layer and the first photoelectric conversion layer 251, so that the second photoelectric conversion layer is separated from the first photoelectric conversion layer by the separation groove. Similarly, the second photoelectric conversion layer is formed at a location which overlaps with the contact hole 87 on the sensor output control line 27. The second photoelectric conversion layer formed on the sensor output control line 27 and the first and second photoelectric conversion layers formed on the lower electrode 212a are separated and electrically insulated from each other.

The upper electrode 212e is selectively formed on the first photoelectric conversion layer 251 of the first and second photoelectric conversion layers, so that the PIN diode 212 is formed by the lower electrode 212a, the first photoelectric conversion layer 251, and the upper electrode 212e. The first and second photoelectric conversion layers, the N-type semiconductor layer 212b, the light receiving layer 212c, and the P-type semiconductor layer 212d which are formed on the lower electrode 212a, the sensor pre-charge control line 26, and the sensor output control line 27, respectively, are simultaneously formed by etching.

The lower electrode 212a is electrically connected to the TFT 211 via the contact hole 84. The upper electrode 212e configures a part of the conductive film 214 formed on the insulating film 47. The upper electrode 212e is formed of a transparent conductive film such as indium tin oxide (ITO). The PIN diode 212 is configured to detect light incident from the upper electrode 212e.

The lower electrode 212a is different from the upper electrode 212e and made of an opaque conductive material. Therefore, incident light from the lower electrode 212a side is blocked, and only incident light from the upper electrode 212e side is accurately detected.

According to the image sensor 1 of the present embodiment, since the lower electrode 212a and the sensor pre-charge control line 26 which are formed corresponding to the contact holes are protected by the second photoelectric conversion layers 252 and 253, the lower electrode 212a and the sensor pre-charge control line 26 which correspond to the contact holes are prevented from being disconnected when the N-type semiconductor layer 212b, the light receiving layer 212c, and the P-type semiconductor layer 212d are etched. Further, since the second photoelectric conversion layer 252 is formed to be separate from the first photoelectric conversion layer 251, a leak current generated in the second photoelectric conversion layer 252 does not affect an operation of the PIN diode 212. Therefore, the photoelectric conversion device with high sensitivity and high yield ratio is provided.

Electro-Optic Device

Next, a liquid crystal device 2 with a built-in photoelectric conversion element as an example of an electro-optic device according to the invention will be described with reference to FIGS. 4 to 9. The liquid crystal device according to the present embodiment is one in which a display function is added to the photoelectric conversion device described above and is configured as a display device. In particular, the liquid crystal device according to the present embodiment is an active matrix type color liquid crystal display (LCD) device with a touch panel function for being capable to receive various kinds of information by detecting a pointing means such as a finger which points to a display surface on which an image is displayed.

Figure 4:
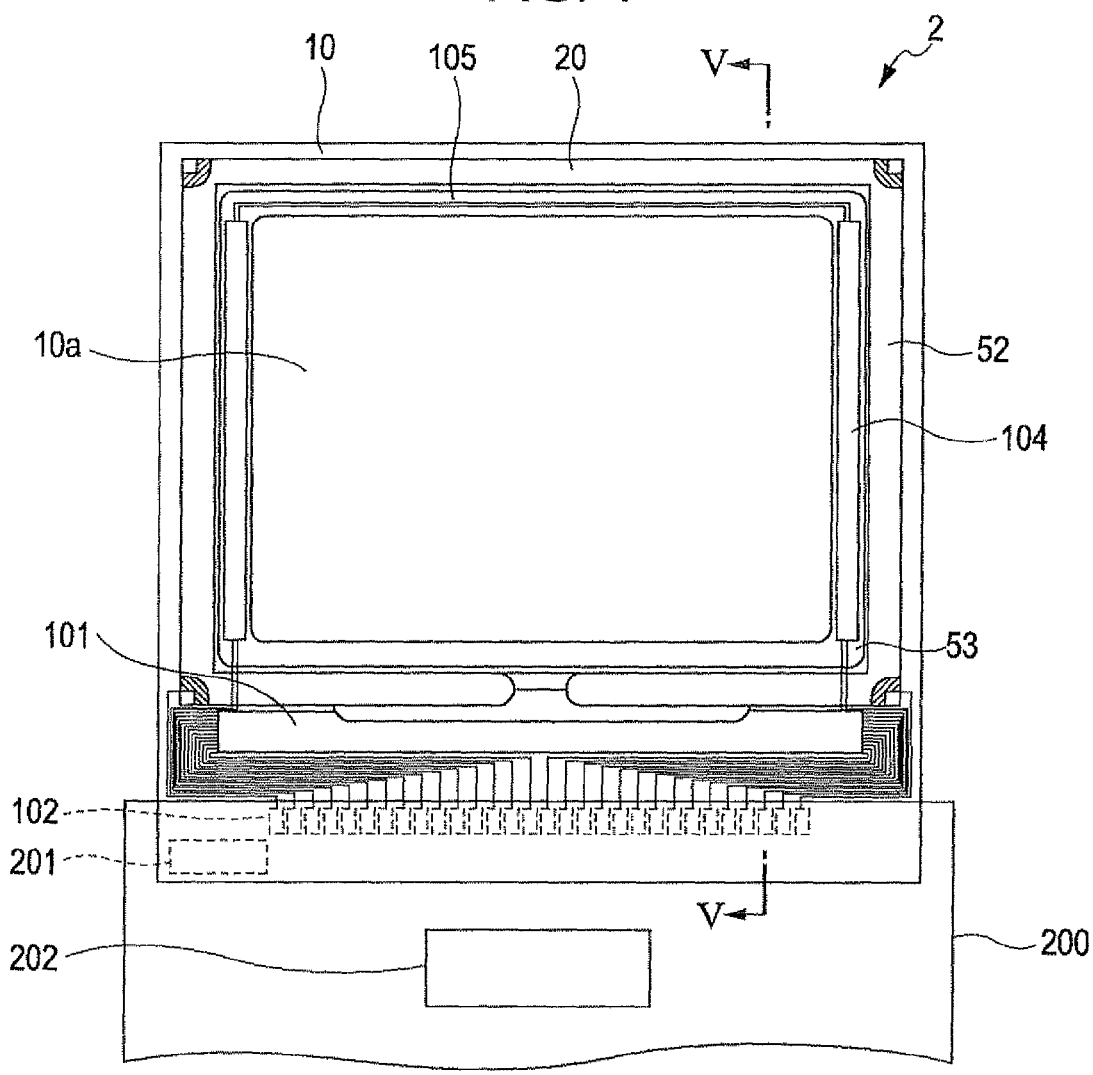
FIG. 4 is a plan view of a liquid crystal device as an example of an electro-optic device of the invention.
Figure 5:
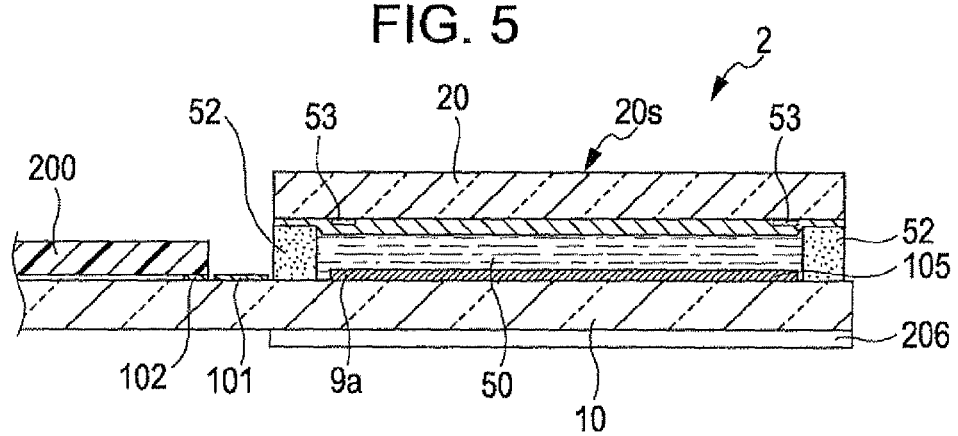
FIG. 5 is a cross-sectional view taken along line V-V of FIG. 4.

In FIGS. 4 and 5, a seal material 52 is formed on a peripheral edge portion of a face area of a TFT array substrate 10 and an opposite substrate 20, and a liquid crystal layer 50 is enclosed in an area surrounded by the TFT array substrate 10, the opposite substrate 20, and the seal material 52. An image display area 10a is disposed inside an area surrounded by the seal material 52, and a plurality of pixels is disposed in the image display area 10a in a matrix form.

The seal material 52 is made of, for example, ultraviolet (UV) curable resin or thermoset resin for bonding the both substrate and is made such that it is coated on the TFT array substrate 10 and cured by UV light irradiation and heating in the manufacturing process. Gap materials such as fiberglass or glass beads for creating a predetermined gap (a gap between substrates) between the TFT array substrate 10 and the opposite substrate 20 are scattered in the seal material 52.

A frame light shielding film 53 which defines a frame area of the image display area 10a is disposed on the opposite substrate 20 side in parallel with the inside of the seal area in which the seal material 52 is disposed. A part or all of the frame light shielding film 53 may be disposed as a built-in light shielding film on the TFT array substrate 10 side. Further, there is a peripheral area around the image display area 10a. That is, in the present embodiment, an area further away from the center of the TFT array substrate 10 than the frame light shielding film 53 is defined as the peripheral area.

In an area of the peripheral area outside a seal area in which the seal material 52 is disposed, a data line driving circuit 101 and an outside circuit connecting terminal 102 are disposed along one side of the TFT array substrate 10. A scan line driving circuit 104 is disposed along another side adjacent to one side to be covered with the frame light shielding film 53. In order to connect the two scan line driving circuits 104 disposed on both sides of the image display area 10a, a plurality of wirings 105 is disposed along the other side of the TFT array substrate 10 to be covered with the frame light shielding film 53.

In the peripheral area on the TFT array substrate 10, a sensor control circuit 201 for controlling the sensor including the PIN diode is disposed. The outer circuit connecting terminal 102 is connected to a connecting terminal disposed on a flexible substrate 200 as an example of a connecting unit which electrically connects an outside circuit with the liquid crystal device 2. A backlight of the liquid crystal device 2 is controlled by a backlight control circuit 202 which is configured by an integrated circuit (IC) mounted on the FPC 200. The sensor control circuit 201 and the backlight control circuit 202 may each be installed inside or outside the liquid crystal device 2.

In FIG. 5, a pixel electrode 9a is formed on the TFT array substrate 10 after the TFT for pixel switching and the wirings such as the scan line and the data line are formed. A stacking structure including a light shielding unit such as a light shielding film 23 of a lattice form or a stripe form is formed on the opposite substrate 20.

The liquid crystal device 2 employs a lateral electric field driving method for controlling an orientation state of the liquid crystal layer 50 by lateral electric field generated between the pixel electrode 9a formed on the TFT array substrate 10 and a common electrode. The liquid crystal layer 50 includes liquid crystals in which, for example, nematic liquid crystals of one or more types are mixed and is driven by lateral electric field generated between the pixel electrode 9a and the common electrode. An image disposed by the liquid crystal device 2 is displayed on a display surface 20s of two surfaces of the opposite substrate 20 at a side which does not face the liquid crystal layer 50. In the present embodiment, for convenience of description, a polarizing plate and a color filter are not illustrated, but when the polarizing plate and the color filer are disposed on the opposite substrate 20, a top surface of the liquid crystal device 2 functions as the display surface in FIG. 5.

The liquid crystal device 2 has a backlight 206 disposed below the TFT array substrate 10 in FIG. 5. The backlight 206 is disposed at a back side of the display surface 20s. The backlight 206 is configured such that semiconductor light emitting elements, which are spot light sources as an example of a light emitting diode, are planarly disposed. The backlight 206 may be configured to include a light emitting diode such as an organic EL element. Further, a backlight of a side light method which emits planar light from a light source disposed on a side thereof through a light guide plate may be used.

On the TFT array substrate 10 illustrated in FIGS. 4 and 5, in addition to the driving circuits such as the data line driving circuit 101 and the scan line driving circuit 104, a sampling circuit which performs sampling of an image signal on an image signal line and supplies the sampled signal to the data line, a pre-charge circuit which supplies a pre-charge signal of a predetermined voltage level to a plurality of data lines ahead of the image signal, respectively, and a test circuit which tests quality and defects of the electro-optic device during manufacturing or at the time of shipping may be formed.

Figure 6:
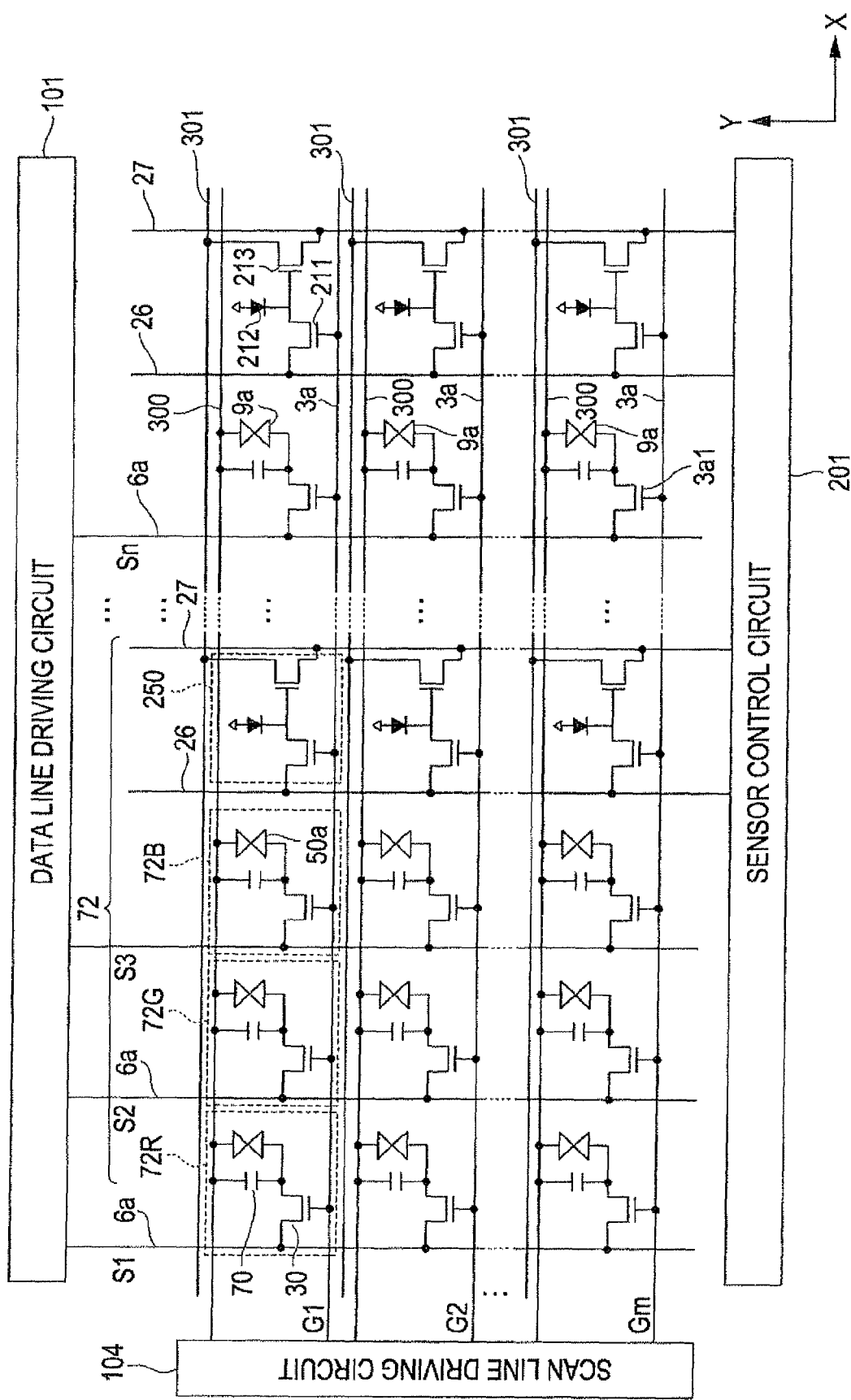
FIG. 6 is an equivalent circuit of an electro-optic device.

Next, a main circuit configuration of the liquid crystal device 2 will be described with reference to FIG. 6. FIG. 6 is an equivalent circuit diagram illustrating various elements and wirings in a plurality of pixels formed in a matrix form which configures the image display area 10a of the liquid crystal device 2.

In FIG. 6, each of the plurality of pixels 72 formed in a matrix form includes a sub pixel 72R which displays red, a sub pixel 72G which displays green, and a sub pixel 72B which displays blue.

Each of the sub pixels 72R, 72G, and 72B include the pixel electrode 9a, the TFT 30, and a liquid crystal element 50a. The TFT 30 is electrically connected to the pixel electrode 9a, switching-controls the pixel electrode 9a at the time of the operation of the liquid crystal device 2, and supplies the image signal to the pixel electrode 9a. In each of the sub pixels 72R, 72G, and 72B, the liquid crystal element 50a is driven by a lateral electric field generated due to the difference between the pixel potential of the pixel electrode 9a to which the image signal is applied and the potential of the common electrode electrically connected to a fixed potential line 300.

The data line 6a to which the image signal is applied is electrically connected to a source of the TFT 30. Image signals S1, S2, . . . , Sn applied to the data line 6a may be sequentially applied in this order or may be applied in units of groups in which a plurality of adjacent data lines 6a are grouped.

The scan line 3a is electrically connected to a gate of the TFT 30. The liquid crystal device 2 is configured to sequentially apply scan signals G1, G2, . . . , Gm to the scan line 3a in a pulse manner in this order at predetermined timing. The pixel electrode 9a is electrically connected to a drain of the TFT 30. The image signals S1, S2, . . . , Sn supplied from the data line 6a are applied at predetermined timing by switching the TFT 30 as a switching element off only during a predetermined time period. The image signals S1, S2, . . . , Sn of a predetermined level applied to liquid crystals through the pixel electrode 9a are maintained between the pixel electrode 9a and the common electrode during a predetermined time period.

In liquid crystals included in the liquid crystal layer 50, an orientation or an order of a molecule set is changed by an applied voltage level to modulate light, thereby enabling gradation display. In a normal-white mode, transmittance of incident light is reduced in response to a voltage applied in sub pixel units, and in a normal-black mode, transmittance of incident light is increased in response to a voltage applied in sub pixel units, so that light which has contrast according to an image signal is emitted from the liquid crystal device 2 as a whole. A storage capacitor 70 is added in parallel with the liquid crystal element 50a formed between the pixel electrode 9a and the common electrode in order to prevent the image signal from leaking.

The liquid crystal device 2 includes a sensor 250 disposed for each pixel 72. The sensor 250 includes a PIN diode 212 as an example of a "photoelectric conversion element" of the invention and TFTs 211 and 213. The sensor 250 is electrically connected to the sensor control circuit 201. The sensor control circuit 201 applies a control signal for controlling an operation of the sensor 250 to the sensor 250 via a sensor pre-charge control line 26, and an output signal including location information of a pointing means detected by the sensor 250 is output to a sensor control circuit 201 via a sensor output control line 27.

A gate of the TFT 211 is electrically connected to a scan line 3a, and a source thereof is electrically connected to the sensor pre-charge control line 26. A drain of the TFT 211 is electrically connected to the PIN diode 212 and the gate of the TFT 213. The TFT 211 is switched to on or off by a control signal applied through the TFT scan line 3a. The PIN diode 212 is pre-charged by a pre-charge voltage applied through the sensor pre-charge control line 26 and the TFT 211.

A gate of the TFT 213 is electrically connected to the PIN diode 212, and the TFT 213 is switched to on or off by a voltage generated in response to a change of a charge amount accumulated in the PIN diode 212. In further detail, since a change in a charge amount occurring in the PIN diode 212 is caused by light detected by the PIN diode 212, when the pointing means is detected by the PIN diode 212, a driving state of the TFT 213 is switched to an on state. The output signal including location information of the pointing means is an amplification signal in which electric potential of a signal line 301 is amplified and output to the sensor output control line 27 via the TFT 213.

Figure 7:
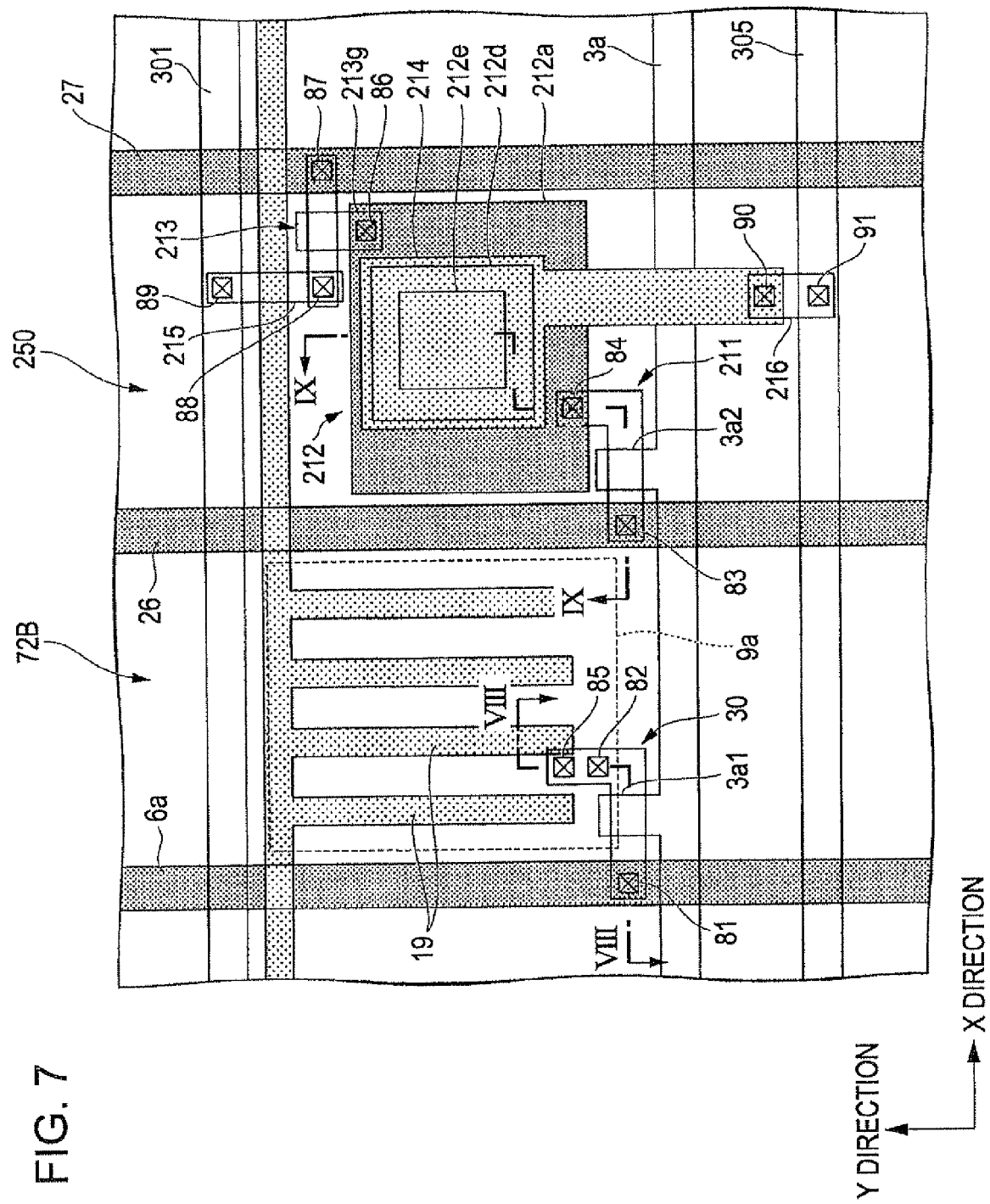
FIG. 7 is a plan view of a sub pixel and a sensor of an electro-optic device.
Figure 8:
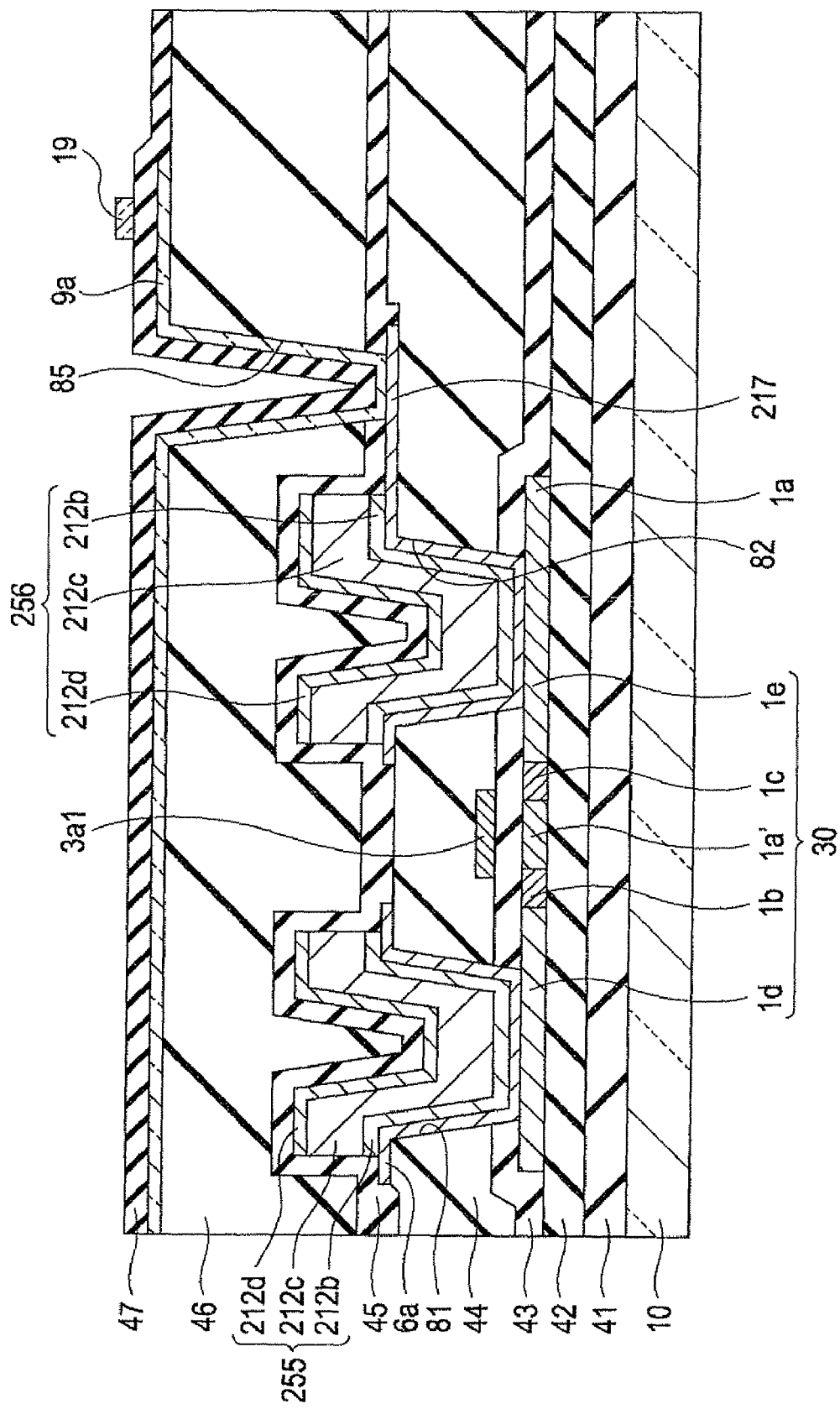
FIG. 8 is a cross-sectional view taken along line VIII-VIII of FIG. 7.
Figure 9:
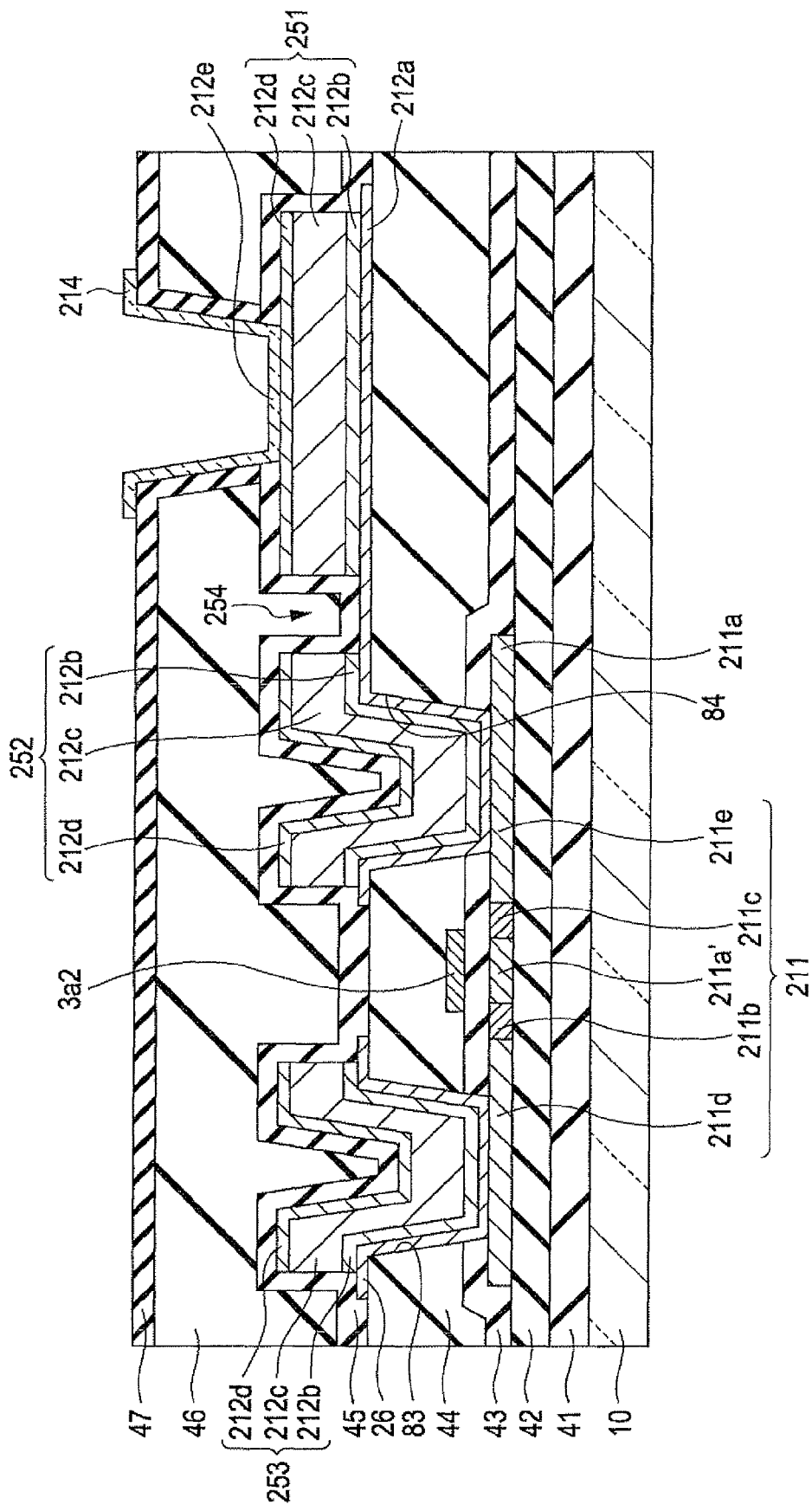
FIG. 9 is a cross-sectional view taken along line IX-IX of FIG. 7.

Next, a configuration of the sub pixel 72B and the sensor 250 will be described in detail with reference to FIGS. 7 to 9. FIG. 7 is a plan view of the sub pixel 72B and the sensor 250. FIG. 8 is a cross-sectional view taken along line VIII-VIII of FIG. 7. FIG. 9 is a cross-sectional view taken along line IX-IX of FIG. 7. In FIGS. 7 to 9, scale sizes of respective layers and respective members are different so that respective layers and respective members can be made to have perceptible sizes.

In FIG. 7, in the sub pixel 72B, a pixel electrode 9a (whose contour is represented by a dotted line) of a rectangular shape in a plane view which is made of a transparent conductive material such as ITO is disposed. The pixel electrodes 9a are disposed in an X direction and a Y direction in a matrix form corresponding to the respective sub pixels. The scan line 3a extends along a boundary of the pixel electrode 9a in the X direction, and the data line 6a extends along a boundary of the pixel electrode 9a in the Y direction.

A common electrode 19 is a transparent conductive electrode made of a transparent conductive material such as ITO similarly to the pixel electrode 9a. The common electrode 19 has a comb-shaped plane shape which extends in the Y direction in FIG. 7 and overlaps with the pixel electrode 9a in a sub pixel area in which the sub pixel 72 is formed.

A source of the TFT 30 is electrically connected to the data line 6a through a contact hole 81, and a drain thereof is electrically connected to the pixel electrode 9a through a contact hole 82, a relay layer 217, and a contact hole 85. Therefore, an image signal applied through the data line 6a from the data line driving circuit 101 is applicable to the pixel electrode 9a in a state in which a driving state of the TFT 30 is switched to an ON state. Electric potential of the common electrode 19 is maintained at a fixed potential of the fixed potential line 300.

In the sensor 250, the PIN diode 212 of a rectangular shape in a plane view is disposed. The PIN diodes 212 are disposed in the X direction and the Y direction in a matrix form corresponding to the respective sensors 250. The scan line 3a, the signal line 301, and a wiring 305 extends along a boundary of the PIN diode 212 in the X direction, and the sensor pre-charge control line 26 and the sensor output control line 27 extend along a boundary of the PIN diode 212 in the Y direction.

A source of the TFT 211 is electrically connected to the sensor pre-charge control line 26 via a contact hole 83, and a drain thereof is electrically connected to a lower electrode 212a of the PIN diode 212 via a contact hole 84. A gate electrode 3a2 of the TFT 211 is a portion that the scan line 3a extends in the Y direction. A driving state of the TFT 211 can be switched by a gate voltage applied to a channel area via the gate electrode 3a2.

A conductive film 214 which includes an upper electrode 212e as a part extends in the Y direction and is connected to the wiring 305 via a contact hole 90, a relay layer 216, and a contact hole 91. The wiring 305 is maintained at a fixed potential by a power source (not illustrated), and the upper electrode 212e is also maintained at a fixed potential.

A source of the TFT 213 is electrically connected to the signal line 301 via a contact hole 89, a relay layer 215, and a contact hole 88, and a drain thereof is electrically connected to the sensor output control line 27 via a contact hole 87. A gate electrode 213g of the TFT 213 is electrically connected to the lower electrode 212a via a contact hole 86.

The PIN diode 212 includes the lower electrode 212a and the upper electrode 212e which respectively contact lower and upper surface of a device body. The lower electrode 212a is electrically connected to the drain of the TFT 211 via a contact hole 84. Therefore, when light is incident to the PIN diode 212 at the time of an operation of the TFTs 211 and 213, an output signal is output to the sensor signal control line 27 in response to light based on an optical current generated in the PIN diode 212.

In FIGS. 8 and 9, the liquid crystal device 2 includes insulating films 41, 42, 43, 44, 45, 46, and 47 which are stacked on a TFT array substrate 10, and the TFTs 30 and 211 are formed in a stacking structure configured by the insulating films.

In FIG. 8, the TFT 30 has the LDD structure in which a channel area 1a', a source area 1d, a drain area 1e, and LDD areas 1b and 1c which are relatively lower in electrical resistance than the source area 1d and the drain area 1e are formed in the semiconductor layer 1a such as a poly silicon layer. Since the TFT 30 has the LDD structure, an off current which flows in the LDD areas 1b and 1c at the time of non operation of the TFT 30 is reduced, and an on current which flows at the time of operation of the TFT 30 is prevented from being lowered. Therefore, the liquid crystal device 2 can display an image of the high quality due to the merits of the LDD structure since there are hardly any flows of light leak current.

The source area 1d is electrically connected to the data line 6a through a contact hole 81, and the drain area 1e is electrically connected to the pixel electrode 9a which extends to a contact hole 85 through a contact hole 82 and is formed below an insulating film 47. A gate electrode 3a1 is formed to overlap with the channel area 1a' with an insulating film 43 interposed therebetween. The common electrode 19 is formed on the insulating film 47. Therefore, in the liquid crystal device 2, the pixel electrode 9a and the common electrode 19 are formed on different layers with the insulting layer 47 interposed therebetween.

In FIG. 9, the TFT 211 also has the LDD structure in which a channel area 211a', a source area 211d, a drain area 211e, and LDD areas 211b and 211c are formed in a semiconductor layer 211a similarly to the TFT 30.

The PIN diode 212 includes the lower electrode 212a, an N-type semiconductor layer 212b, a light receiving layer 212c formed of a poly-silicon layer, a P-type semiconductor layer 212d, and the upper electrode 212e, which are stacked on the insulating film 44 in this order. Therefore, the PIN diode 212 can detect reflective light reflected by the pointing means such as a finger which points to the display surface 20s of the image display area 10a or outside light which is not shielded by the pointing means.

In FIGS. 8 and 9, the "photoelectric conversion layer" of the invention is formed by the N-type semiconductor layer 212b, the light receiving layer 212c, and the P-type semiconductor layer 212d. As illustrated in FIG. 9, a first photoelectric conversion layer 251 disposed at a location which does not overlap with the contact hole 84 and a second photoelectric conversion layer 252 disposed at a location which overlaps with the contact hole 84 are formed on the lower electrode 212a. A separation groove 254 is formed between the first photoelectric conversion layer 251 and the second photoelectric conversion layer 252. The first photoelectric conversion layer 251 and the second photoelectric conversion layer 252 are separated from each other by the separation groove 254.

Similarly, a second photoelectric conversion layer 253 is formed at a location which overlaps with a contact hole 83 on the sensor pre-charge control line 26. The second photoelectric conversion layer 253 formed on the sensor pre-charge control line 26 and the first and second photoelectric conversion layers 251 and 252 formed on the lower electrode 212a are separated from each other and electrically insulated from each other.

Returning back to FIG. 8, similarly, on the data line 6a and the relay layer 217, second photoelectric conversion layers 255 and 256 are also formed at a location which overlaps with contact holes 81 and 82. The second photoelectric conversion layer 255 formed on the data line 6a and the second photoelectric conversion layer 256 formed on the relay layer 217 are separated and electrically insulated from each other. The second photoelectric conversion layers 255 and 256 are separated and electrically insulated from the second photoelectric conversion layer 253 formed on the sensor pre-charge control line 26 and the first and second photoelectric conversion layers 251 and 252 formed on the lower electrode 212a.

Even though not illustrated, in FIG. 7, the second photoelectric conversion layer is also formed at a location which overlaps with the contact hole 86 on the lower electrode 212a. A separation groove is formed between the second photoelectric conversion layer and the first photoelectric conversion layer 251, so that the second photoelectric conversion layer is separated from the first photoelectric conversion layer by the separation groove. Similarly, the second photoelectric conversion layer is also formed at a location which overlaps with the contact hole 87 on the sensor output control line 27. The second photoelectric conversion layer formed on the sensor output control line 27 and the first and second photoelectric conversion layers formed on the lower electrode 212a are separated and electrically insulated from each other.

The upper electrode 212e is selectively formed on the first photoelectric conversion layer 251 of the first and second photoelectric conversion layers, so that the PIN diode 212 is formed by the lower electrode 212a, the first photoelectric conversion layer 251, and the upper electrode 212e. The first and second photoelectric conversion layers which are formed on the lower electrode 212a, the data line 6a, the sensor pre-charge control line 26, and the sensor output control line 27 are simultaneously formed by etching the N-type semiconductor layer 212b, the light receiving layer 212c, and the P-type semiconductor layer 212d.

The lower electrode 212a is electrically connected to the TFT 211 via the contact hole 84. The upper electrode 212e configures a part of the conductive film 214 formed on the insulating film 47. That is, in the liquid crystal device 2, the upper electrode 212e of the PIN diode 212 is formed on the same layer as the common electrode 19 in the TFT array substrate 10.

Therefore, according to the liquid crystal device 2, the upper electrode 212e can be formed by the same process as a process of forming the common electrode 19, and a manufacturing process of manufacturing the liquid crystal device 2 can be simplified compared to the case where the common electrode 19 and the upper electrode 212e are formed by different processes.

In addition, since the pixel electrode 9a and the common electrode 19 are transparent electrodes, the upper electrode 212e is also transparent. Therefore, since an opening area through which display light for displaying an image substantially transmits is not reduced and light incident to the PIN diode 212 from the display surface 20s is not blocked by the upper electrode 212e, the display light and the incident light reach the light receiving layer 212c through the pixel electrode 9a and the common electrode 19 in the TFT array substrate 10. Therefore, according to the liquid crystal device 2, detection sensitivity of the PIN diode 212 for detecting the pointing means can be increased without deteriorating display performance for displaying an image by the liquid crystal device 2.

Further, as illustrated in FIGS. 8 and 9, in the liquid crystal device 2, the lower electrode 212a is formed on the same layer as the relay layer 217 formed on the insulating film 44. Therefore, according to the liquid crystal device 2, the lower electrode 212a can be formed by using a process of forming the relay layer 217, and thus the manufacturing process of manufacturing the liquid crystal device 2 can be further simplified.

The lower electrode 212a is different from the upper electrode 212e and made of an opaque conductive material. That is, the lower electrode 212a may be also used as a light shielding film for shielding light source light emitted from the back light 206. When displaying an image on the image display area 10a, light source light emitted from the backlight 206 can be prevented from being irradiated to the PIN diode 212, so that the pointing means can be accurately detected by the PIN diode 212.

According to the liquid crystal device 2 of the present embodiment, the manufacturing process of the liquid crystal device 2 can be simplified, the opening area is not reduced, and it is possible to increase detection sensitivity of the PIN diode 212 for detecting outside light which is not blocked by the pointing means for pointing to the display surface 20s or light reflected by the pointing means.

Since a portion of the lower electrode 212a, the pre-charge control line 26, the data line 6a, and the relay layer 217 which are formed corresponding to the contact holes are protected by the second photoelectric conversion layers 252, 253, 255, and 256, the lower electrode 212a, the sensor pre-charge control line 26, the data line 6a, and the relay layer 217 which correspond to the contact holes are prevented from being disconnected when the N-type semiconductor layer 212b, the light receiving layer 212c, and the P-type semiconductor layer 212d are etched. Further, since the second photoelectric conversion layer 252 is formed to be separate from the first photoelectric conversion layer 251, a leak current generated in the second photoelectric conversion layer 252 does not affect an operation of the PIN diode 212. Therefore, the electro-optic conversion device with high sensitivity and high yield ratio is provided.

Electronic Device

The photoelectric conversion device according to the invention may be used in a two-dimensional sensor, an image sensor, and an optical touch sensor. In the invention, the photoelectric conversion element defines X rays as well as light as an object to be converted into an electrical signal, and a photoelectric conversion device to which the invention is applied may be used for taking an X-ray photograph. The photoelectric conversion device according to the invention may have a display function and be mounted in an electronic device as will be described in a second embodiment.

Figure 10:
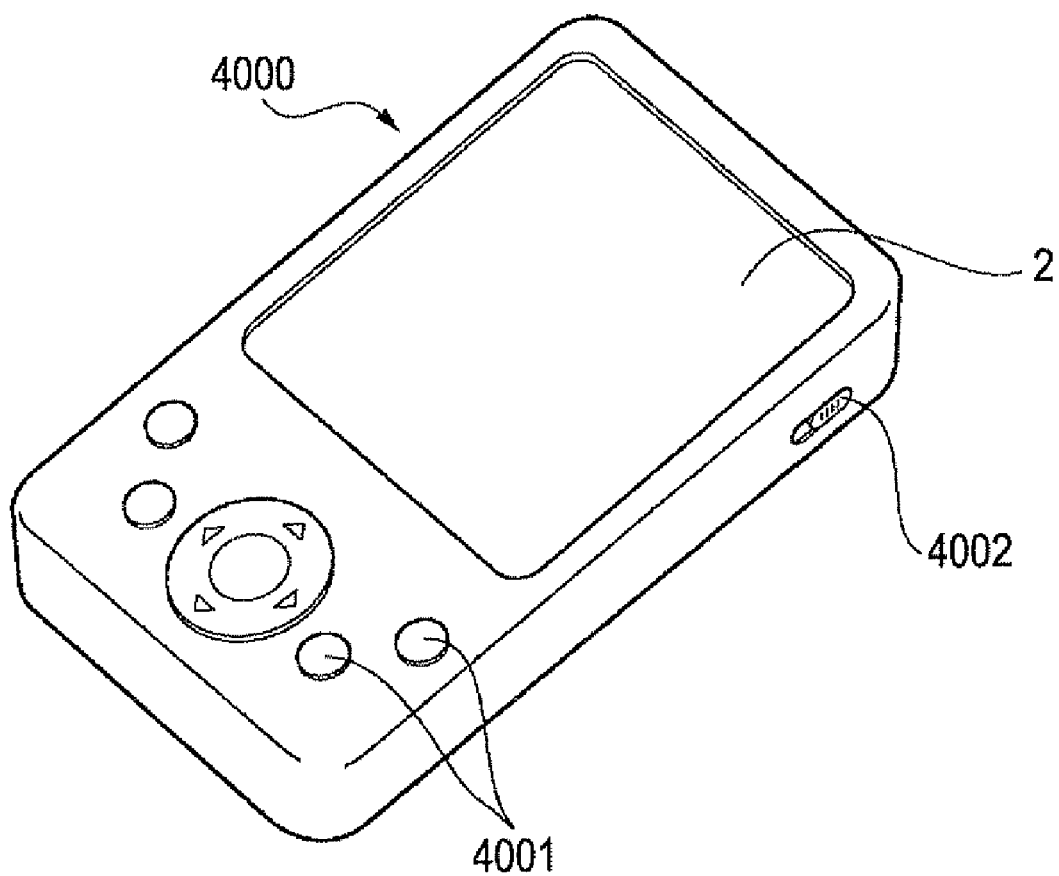
FIG. 10 is a perspective view of a portable information terminal as an example of an electronic device of the invention.

FIG. 10 is a schematic perspective view illustrating a portable information terminal (a personal digital assistant (PDA)) as an example of an electronic device with the electro-optic device 2. The portable information terminal 4000 includes a plurality of operation buttons 4001, a power switch 4002, and an electro-optic device 2 as a display unit. When the power switch 4002 is operated, various kinds of information such as a contact list or a schedule book is displayed on the electro-optic device 2.

Examples of the electronic device to which the photoelectric conversion device of the invention is applied include a digital still camera, a liquid crystal television, a view finder type monitor direct-view video tape recorder, a car navigation device, a pager, an electronic organizer, an electronic calculator, a word processor, a work station, a video telephone, a POS terminal, and a device with a touch panel as well as one illustrated in FIG. 10. The electro-optic device 2 can be applied as a display unit of various electronic devices.

The entire disclosure of Japanese Patent Application No. 2009-001532, filed Jan. 7, 2009 is expressly incorporated by reference herein.

What is claimed is:

1. A photoelectric conversion device, comprising:
   a photoelectric conversion element in which a first electrode, a photoelectric conversion layer, and a second electrode are stacked in this order; and
   a thin film transistor (TFT) connected to the first electrode of the photoelectric conversion element via a contact hole,
   wherein the photoelectric conversion layer includes a first photoelectric conversion layer disposed at a location which does not overlap with the contact hole and a second photoelectric conversion layer disposed at a location which overlaps with the contact hole,
   the first photoelectric conversion layer and the second photoelectric conversion layer are separated from each other by a separation groove, and
   the second electrode is selectively formed on the first photoelectric conversion layer of the first and second photoelectric conversion layers, and the photoelectric conversion element is formed by the first electrode, the first photoelectric conversion layer, and the second electrode.

2. An electro-optic device in which a pixel, in which a pixel electrode is formed, and a sensor, in which a photoelectric conversion element is formed, are formed on the same substrate, comprising:

the photoelectric conversion element including a first electrode, a photoelectric conversion layer, and a second electrode which are stacked in this order; and a thin film transistor (TFT) connected to the first electrode of the photoelectric conversion element via a contact hole, wherein the photoelectric conversion layer includes a first photoelectric conversion layer disposed at a location which does not overlap with the contact hole and a second photoelectric conversion layer disposed at a location which overlaps with the contact hole, the first photoelectric conversion layer and the second photoelectric conversion layer are separated from each other by a separation groove, and the second electrode is selectively formed on the first photoelectric conversion layer of the first and second photoelectric conversion layers, and the photoelectric conversion element is formed by the first electrode, the first photoelectric conversion layer, and the second electrode.

3. An electronic device comprising an electro-optic device according to claim 2.

* * * * *